United States Patent [19]

Block

[11] Patent Number: 4,863,521

[45] Date of Patent: Sep. 5, 1989

[54] SPRAY DRYING MONOCARBOXYLATE MIXTURES

[75] Inventor: Jacob Block, Rockville, Md.

[73] Assignee: W. R. Grace & Co.-Conn., New York, N.Y.

[21] Appl. No.: 215,962

[22] Filed: Jul. 7, 1988

[51] Int. Cl.$^4$ .................. H01B 1/06; H01L 39/00; B05D 5/06; C01F 17/00

[52] U.S. Cl. ........................... 106/470; 252/1; 252/500; 252/518; 252/521; 423/263; 423/593; 428/402; 428/930; 505/1; 505/809; 505/810; 505/815; 427/62; 501/152; 156/DIG. 63

[58] Field of Search .................. 423/593, 1, 263; 505/809, 810, 815, 816, 818, 819; 427/45.1, 55, 62, 63, ; 252/500, 518, 521, 1; 501/12, 152; 428/402; 156/DIG. 63; 106/470

[56] References Cited

U.S. PATENT DOCUMENTS

| | | | |
|---|---|---|---|
| 3,373,119 | 3/1968 | Krystniak | 423/593 |
| 3,796,793 | 3/1974 | Metzer et al. | 423/593 |
| 4,049,789 | 9/1977 | Manabe et al. | 423/593 |
| 4,318,995 | 3/1982 | Rhodes et al. | 423/593 |
| 4,649,037 | 3/1987 | Marsh et al. | 423/628 |

OTHER PUBLICATIONS

Kodas et al, Aerosol Flow Reactor Production of Fine YBa$_2$Ca$_3$O$_7$ Powder Fabrication of Superconducting Ceramics, High Temperature Super Conductors II, D. W. Capone et al editor, Materials Research Society Apr. 5-9, 1988, pp. 367-369.

Nasu et al, Ba$_2$YCu$_3$O$_x$ Films Prepared by Pyrolysis of Organic or Inorganic Salts, High Temperature Superconductors II, D. W. Capone et al Editor, Materials Research Society Apr. 5-9, 1988, pp. 101-104.

Rice et al, Preparation of Superconducting Thin Films of BA$_2$YCu$_3$O$_7$ By a Novel Spin-on Pyrolysis Technique Applied Physics Letters 51 (22) 30 Nov. 87, pp. 1842-1844.

Rice et al Superconducting Thin Films of High T$_c$ Cuprates Prepared by Spin on Pyrolysis, American Vacuum Society Series 3, Thin Film Processing & Characterization of High Temperature Superconductors 6 Nov. 1987, pp. 198-203.

Wu et al, Superconductivity at 93 K in a New Mixed Phase Y-Ba-CuO Compound System at Ambient Pressure, *Phys. Rev. Lett.*, 58, 908-910 (2 Mar. 1987).

Engler et al, Superconductivity above Liquid Nitrogen Temperature: Preparation and Properties of a Family of Perovskite-Based Superconductors, *J. Am. Chem. Soc.* 109, 2848-2849 (1987).

Wang et al, Comparison of Carbonate, Citrate, and Oxalate Chemical Routes to the High-Tc Metal Oxide Superconductors La$_{2-x}$Sr$_x$CuO$_4$, *Inorg. Chem.* 26, Bednorz, J. G. et al, Possible High Tc Superconductivity in the Ba-La-Cu-O System, *Zeit. Phys. B.*, 64, 189-193 (1986), (English).

Spray Drying, Van Nostrands Sci. Ency., 6th Ed 2657-2658 (1983).

Cava, R. J., et al, Bulk Superconductivity at 91 K in Single-Phase Oxygen Deficient Perovskite Ba$_2$YCu$_3$O$_{9-\delta}$, *Phys. Rev. Lett.*, 58, 1676-1679 (4-20-87).

Nguyen, N. et al, Oxygen Defect K$_2$NiF$_4$-Type Oxides: The Compounds La$_{2-x}$Sr CuO$_{4-x/2+\delta}$, *Jour. Solid State Chem.*, 39, 120-127 (1981).

Nguen, N., et al., Oxydes Ternaires de Cuivre a Valence Mixte de Type K$_2$NiF$_4$ Deficitaires en Oxygene: Evolution Progressive d'un Etat Semi-conducteur vers un Etat Semi-metallique Des Oxydes La$_{2-x}$Sr$_x$-CuO$_{4-x/2+\delta}$ *J. Phys. Chem.* Solids, 44, 389-400 (1983).

*Primary Examiner*—Gary P. Straub
*Attorney, Agent, or Firm*—William W. McDowell, Jr.

[57] ABSTRACT

An aqueous solution of the monocarboxylates of Y, Ba, and Cu is spray dried, providing a contaminant-free non-hygroscopic product which is homogeneous at the atomic level. In a preferred embodiment Y, Ba, and Cu acetates are used in a molecular ratio of 1:2:3, giving a product which can be calcined to give a superconducting mixed oxide, YBa$_2$Cu$_3$O$_x$, where x is 6.8-7.0.

4 Claims, No Drawings

SPRAY DRYING MONOCARBOXYLATE MIXTURES

RELATED APPLICATION

U.S. Ser. No. 188,926 filed May 2, 1988, Block and Dolhert, discloses spray drying aqueous acetates of Ca, Ba, and Cu, followed by mixing with $Tl_2O_3$ and calcination to make a superconductor. That application is herein incorporated by reference in its entirety. This instant application is a continuation-in-part of said U.S. Ser. No. 188,926.

U.S. Ser. No. 95,084 filed Sept.11, 1987, Spencer and Cheng, is directed to spray drying an aqueous solution of water-soluble salts (specifically nitrates) of Y, Ba, and Cu. Monocarboxylates are not disclosed as the salts. Said application is owned by the common assignee hereof. The application is herein incorporated by reference in its entirety.

FIELD OF THE INVENTION

The invention is directed to making ceramic mixed oxides.

SUMMARY OF THE INVENTION

A 10–15 weight percent aqueous solution of the monocarboxylates of Y, Ba, and Cu is spray dried, providing a contaminant-free non-hygroscopic product which is homogeneous at the atomic level. In a preferred embodiment Y, Ba, and Cu acetates are used in a molecular ratio of 1:2:3, giving a product which can be calcined in air at 800° C. then in oxygen at 900° C. to give a superconducting mixed oxide, $YBa_2Cu_3O_x$, where x is 6.8–7.0.

BACKGROUND OF THE INVENTION

A method for obtaining a pure mixture of salts of yttrium, barium, and copper is to spray dry an aqueous solution of the nitrates. This method is disclosed and claimed in U.S. Ser. No. 95,084, supra. and see CA Selects: Colloids (Applied Aspects), Issue 12, 1988, 108:208961V, disclosing spray drying an aqueous solution of Y, Ba, and Cu nitrates.

Spray drying the nitrates does indeed avoid introduction of impurities, preserves the stoichiometry of the starting ingredients, and provides ready anion burn-off, leaving the pure mixed Y-Ba-Cu oxides, homogeneous at the atomic level. All of these features are important in the conversion of the mixed nitrates to a superconductor. However, from the production viewpoint, spray drying the solution of mixed nitrates suffers a serious disadvantage in that the spray dried nitrate product is hygroscopic. The product begins to absorb atmospheric moisture as soon as it is removed from the dryer, and it will quickly clump and cake, and will not flow freely. In this form it is difficult to process further. Handling requires minimal ambient exposure, and storage and shipping requires immediate hermetic sealing.

My invention provides a non-hygroscopic spray dried product and therefore avoids the foregoing problems. My invention is in the nature of an improvement in the above described spray drying process in that I substitute a mixture of monocarboxylates for the stated nitrates, other conditions being substantially the same. These monocarboxylates are the formates, acetates, propionates, and butyrates, being those generally derivable from monocarboxylic acids of the formula RCOOH, where R is H or alkyl of 1–4 carbons. A suitable monocarboxylate concentration for spray drying is about 10–15%.

The following example illustrates without limiting the invention.

EXAMPLE $Y_2O_3$ (10.49 g) was weighed out and dissolved (by heating) in a mixture containing 42.0 g glacial acetic acid and 315.7 g $H_2O$. $BaCO_3$ (39.5 g) was dissolved in the above solution. 807 g $H_2O$ and 28.6 g glacial acetic acid was added, and then 59.9 g copper acetate monohydrate was dissolved in the above. The slightly turbid solution was then filtered through a 0.45 micron filter.

The solution was then spray dried in a Niro spray dryer at the following conditions: Inlet temperature=300° C., outlet temperature=110° C., air pressure=4.5 Bars. 51.8 g were collected (fine portion). SEM analysis showed that these particles were spherical and about 2–13 microns in diameter. The product was non-hygroscopic and free-flowing. After intermittent exposure to air it continued to be free-flowing. A comparable sample of spray dried nitrates was hygroscopic and became non-free flowing under the same experimental conditions.

A portion (24 g) of the spray dried acetate powder was placed in an alumina boat and calcined in air at the following schedule: To 400° C. at 3°/min, at 400° C. for 2 hours, to 800° C. at 5°/min, at 800° C. for 1 hour. The resulting product was a black friable powder (12.5 g).

The above powder (10.7 g) was fired in oxygen (235 cc/min) under the following schedule: To 950° C. in 4.5 hours, at 950° C. for 4 hours, to 600° C. in 2 hours, to 300° C. in 13 hours, to 200° C. in 1 hour. 9.6 g of powder were recovered. The powder was pressed into a pellet and was found to exhibit the Meissner effect (float a large magnet) in liquid nitrogen, indicating the pellet was superconducting.

X-ray diffraction of the powder product showed a single phase product, $YBa_2Cu_3O_x$, where x=6.8–7.0.

SPRAY DRYING

Another useful spray dryer is a bench scale unit, a Yamato Model GS 21 with a GF-31 attachment, made by Yamato USA, Inc., Northbrook, Ill. In this unit the atomizer operates with compressed nitrogen, and air preheated to about 150° C. is used in the drying chamber. The collecting pot operates on a cyclone principle and is vented to the hood.

Commercial-scale spray dryers are recommended for larger operations. A variety is available, but all are based on two essential functions: (1) the feed is atomized; and (2) the atomized feed is dried in a stream of hot gas. Atomizers take various forms. The two most frequently found are the centrifugal-wheel—where the feed is flung as a fine spray from a rapidly whirling disk; and the pressure-nozzle atomizer (rather like a garden hose nozzle sprayer). The aim of course is to produce particles such that the largest will be completely dried during its retention time in the hot-gas chamber, where gas flow may be co- or counter- to particle flow. All of these considerations are well within the routine skill of the spray drying art. (Cf. the article, Spray Drying, in Van Nostrand's Scientific Encyclopedia, 6th Ed., 2657–2658 [1983].)

As indicated in U.S. Ser. No. 95,084 supra spray drying provides mixed salts of extreme purity, since contaminants that would ordinarily be introduced by grinding and regrinding are avoided, as are precipitants that tend to leave undesirable cationic residues, e.g., potassium carbonate.

LEVITATION TEST FOR SUPERCONDUCTIVITY

Various tests are available for the determination of superconductivity. One of these tests is conventional, simple, and is accepted in the art as definitive. I used this, the so-called levitation test, or Meissner effect, in my determinations, and I describe it below.

A circular wafer of the compound is prepared by calcining and compressing as described in the above Example. The wafer is about 1-inch in diameter and about 3/16-inch thick. It is placed in the center of a glass dish, and then liquid nitrogen (77° K.) is poured into the dish.

The wafer bubbles a bit at first, as the nitrogen boils on contact, and as surface air is flushed from the wafer. In a few minutes gas evolution diminishes to nearly zero, and the wafer may be assumed to be chilled to approximately the temperature of liquid nitrogen. A chip of a rare earth magnet is now dropped gently over the wafer. If the magnet levitates, i.e., hovers in the air over the wafer (Meissner effect), the wafer is superconducting.

I claim:

1. Spray-dried, free flowing, non-hygroscopic particles consisting essentially of a homogeneous mixture of monocarboxylates of Y, Ba, and Cu, said monocarboxylates being selected from the group consisting of formates, acetates, propionates, and butyrates.

2. Composition according to claim 1 wherein the monocarboxylates are acetates.

3. Composition according to claim 2 wherein the molecular ratio of acetates is $Y_1$-$Ba_2$-$Cu_3$.

4. Composition according to claim 3 wherein the particles are about 2-13 microns in diameter.

* * * * *